United States Patent
Kawahara et al.

(10) Patent No.: US 11,404,547 B2
(45) Date of Patent: Aug. 2, 2022

(54) SEMICONDUCTOR DEVICE WITH CONDUCTIVE MEMBERS THAT EXTEND FROM A SEMICONDUCTOR PORTION TO AN UPPER SURFACE OF A SEMICONDUCTOR LAYER

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shinji Kawahara, Yokohama Kanagawa (JP); Nobuyuki Toda, Kawasaki Kanagawa (JP); Takeshi Yamamoto, Kawasaki Kanagawa (JP); Kazuaki Yamaura, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/807,030

(22) Filed: Mar. 2, 2020

(65) Prior Publication Data
US 2021/0083059 A1     Mar. 18, 2021

(30) Foreign Application Priority Data
Sep. 12, 2019   (JP) .............................. JP2019-166231

(51) Int. Cl.
*H01L 29/40*       (2006.01)
*H01L 49/02*       (2006.01)
*H01L 29/06*       (2006.01)

(52) U.S. Cl.
CPC ............ *H01L 29/407* (2013.01); *H01L 28/20* (2013.01); *H01L 29/0649* (2013.01); *H01L 29/404* (2013.01)

(58) Field of Classification Search
CPC . H01L 29/407; H01L 29/0649; H01L 29/404; H01L 28/20
(Continued)

(56) References Cited

U.S. PATENT DOCUMENTS 5,304,838 A     4/1994   Ozawa
5,981,995 A *  11/1999   Selcuk .................... H01L 27/11
                                           257/330
(Continued)

FOREIGN PATENT DOCUMENTS

| EP | 0621631 B1 | 6/2001 |
| JP | S63122147 A | 5/1988 |
| JP | 3739814 B2 | 1/2006 |

*Primary Examiner* — Mohammad M Hoque
(74) *Attorney, Agent, or Firm* — Kim & Stewart LLP

(57) ABSTRACT

A semiconductor device includes a semiconductor layer of a first conductivity type, a first semiconductor portion of a second conductivity type provided in the semiconductor layer, first and second conductive members, each having an upper end reaching an upper surface of the semiconductor layer and a lower end connected to the first semiconductor portion, and first and second insulating films covering side surfaces of the first and second conductive members, respectively. A length from the upper end to the lower end of the first conductive member is greater than a total of a length of the first conductive member, a distance between the first conductive member and the second conductive member, and a length of the second conductive member in a direction from the first conductive member toward the second conductive member that is parallel to the upper surface of the semiconductor layer.

13 Claims, 8 Drawing Sheets

(58) Field of Classification Search
USPC .......................................................... 257/488
See application file for complete search history.

(56) References Cited

U.S. PATENT DOCUMENTS

| | | |
|---|---|---|
| 2001/0022385 A1 | 9/2001 | Sakakibara et al. |
| 2002/0068428 A1 | 6/2002 | Kuwazawa |
| 2005/0263850 A1* | 12/2005 | Aitken .................. H01L 27/101 |
| | | 257/536 |
| 2008/0213972 A1* | 9/2008 | Disney .............. H01L 21/76267 |
| | | 438/430 |
| 2008/0237783 A1* | 10/2008 | Williams ........ H01L 21/823878 |
| | | 257/513 |
| 2011/0318894 A1* | 12/2011 | Kobayashi ........ H01L 29/66734 |
| | | 438/270 |
| 2015/0270256 A1* | 9/2015 | Edwards ............. H01L 27/0259 |
| | | 257/197 |

* cited by examiner

SEMICONDUCTOR DEVICE WITH CONDUCTIVE MEMBERS THAT EXTEND FROM A SEMICONDUCTOR PORTION TO AN UPPER SURFACE OF A SEMICONDUCTOR LAYER

CROSS-REFERENCE TO RELATED APPLICATION(S)

This application is based upon and claims the benefit of priority from Japanese Patent Application No. 2019-166231, filed Sep. 12, 2019, the entire contents of which are incorporated herein by reference.

FIELD

Embodiments described herein relate generally to a semiconductor device.

BACKGROUND

In a semiconductor device, a resistance element is provided as a circuit component. When stress is applied to a chip, the resistance of the resistance element varies. The resistance element is typically required to have stable resistance and enable a reduction in size.

DETAILED DESCRIPTION

Embodiments provide a semiconductor device in which variations in the resistance of a resistance element can be reduced even when stress is applied and that enables a reduction in size.

In general, according to one embodiment, a semiconductor device includes a semiconductor layer of a first conductivity type, a first semiconductor portion of a second conductivity type provided in the semiconductor layer, a first conductive member having an upper end reaching an upper surface of the semiconductor layer and a lower end connected to the first semiconductor portion, a second conductive member having an upper end reaching the upper surface of the semiconductor layer and a lower end connected to the first semiconductor portion, a first insulating film covering a side surface of the first conductive member to electrically isolate the first conductive member from the semiconductor layer, and a second insulating film covering a side surface of the second conductive member to electrically isolate the first conductive member from the semiconductor layer. A length from the upper end to the lower end of the first conductive member is greater than a total of a length of the first conductive member, a distance between the first conductive member and the second conductive member, and a length of the second conductive member in a direction from the first conductive member toward the second conductive member that is parallel to the upper surface of the semiconductor layer.

First Embodiment

Next, a first embodiment will be described.

Figure 1A:
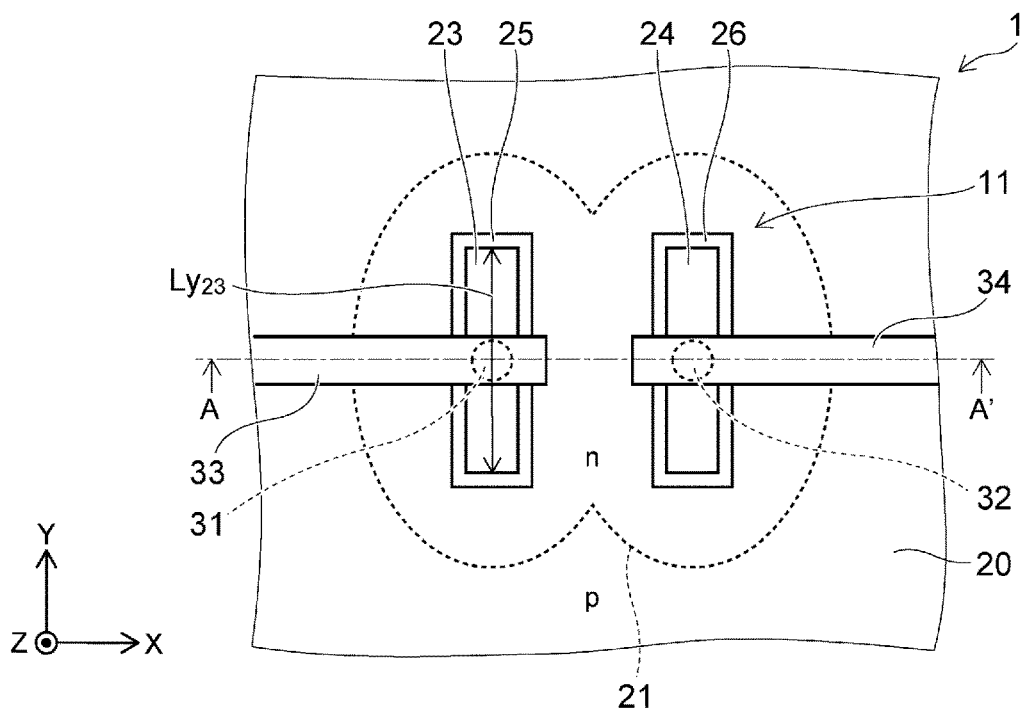
FIG. 1A is a plan view showing a semiconductor device according to a first embodiment.
Figure 1B:
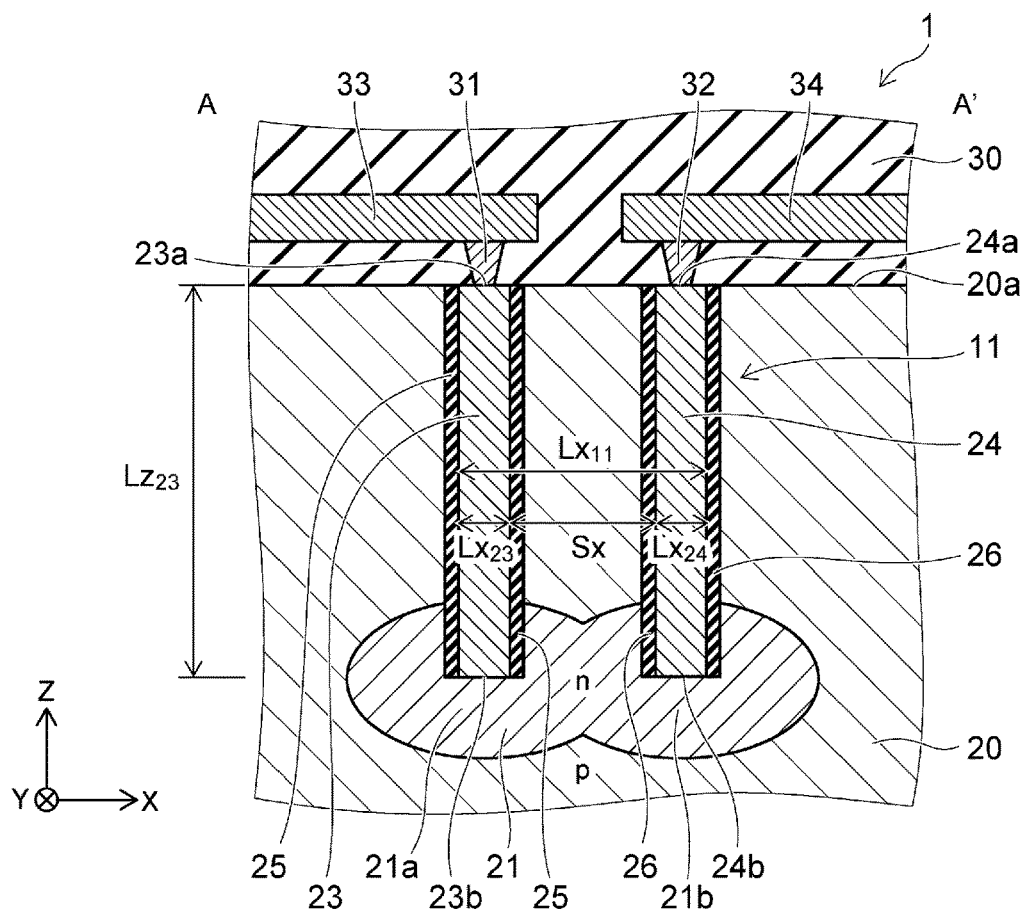
FIG. 1B is a cross-sectional view taken along line A-A' shown in FIG. 1A.

FIG. 1A is a plan view showing a semiconductor device according to the present embodiment, and FIG. 1B is a cross-sectional view taken along line A-A' shown in FIG. 1A.

As shown in FIGS. 1A and 1B, a semiconductor device 1 according to the present embodiment includes a semiconductor layer 20 made of silicon (Si) whose conductivity type is a p-type. The semiconductor layer 20 is, for example, a semiconductor substrate or an upper portion thereof. A semiconductor portion 21 containing silicon whose conductivity type is, for example, an n-type is provided inside the semiconductor layer 20. The semiconductor portion 21 is separated from an upper surface 20a of the semiconductor layer 20.

Hereinafter, for convenience of explanation, an XYZ orthogonal coordinate system is adopted. Two directions which are parallel to the upper surface 20a of the semiconductor layer 20 and orthogonal to each other are referred to as "X direction" and "Y direction", and a direction orthogonal to the upper surface 20a is referred to as "Z direction". Further, in the Z direction, a direction from the inside of the semiconductor layer 20 toward the upper surface 20a is referred to as "up", and a direction opposite to "up" is referred to as "down". However, this expression is for convenience of description, and is independent of the direction of gravity.

In the semiconductor layer 20, two conductive members 23 and 24 are provided to be separated from each other in the X direction. The conductive members 23 and 24 are made of a conductive material, for example, polysilicon that contains impurities. Each shape of the conductive members 23 and 24 has, for example, a flat plate shape that extends along a YZ plane. An upper end 23a of the conductive member 23 and an upper end 24a of the conductive member 24 reach the upper surface 20a of the semiconductor layer 20. On the other hand, a lower end 23b of the conductive member 23 is connected to one portion 21a of the semiconductor portion 21, and a lower end 24b of the conductive member 24 is connected to the other portion 21b of the semiconductor portion 21. The lower end 24b is separated from the lower end 23b in the X direction. In this specification, "connection" means electrical connection.

A height of the conductive member 23, that is, a length $Lz_{23}$ in the Z direction is greater than a width of the conductive member 23, that is, a length $Ly_{23}$ in the Y direction. Further, the length $Ly_{23}$ is greater than a thickness of the conductive member 23, that is, a length $Lx_{23}$ in the X direction. Therefore, $Lz_{23}>Ly_{23}>Lx_{23}$. In some embodiments, the length $Ly_{23}$ may be greater than the length $Lz_{23}$.

Further, the semiconductor device 1 includes insulating films 25 and 26 made of, for example, silicon oxide ($SiO_2$) as insulating members. The insulating film 25 has a substantially rectangular tube shape, and covers side surfaces of the conductive member 23, and does not covering the upper end 23a and the lower end 23b of the conductive member 23. Similarly, the insulating film 26 also has a substantially rectangular tube shape, and covers side surfaces of the conductive member 24, and does not cover the upper end 24a and the lower end 24b of the conductive member 24. The conductive member 23 is insulated from the semiconductor layer 20 by the insulating film 25, and the conductive member 24 is insulated from the semiconductor layer 20 by the insulating film 26. The insulating film 25 and the insulating film 26 are separated from each other. A part of the semiconductor layer 20 and a part of the semiconductor portion 21 are disposed between the insulating film 25 and the insulating film 26. A part of the insulating film 25 and a part of the insulating film 26 are disposed between the conductive member 23 and the conductive member 24.

A shape of the semiconductor portion 21 is, for example, a shape in which an ellipsoid centered on the portion 21a and an ellipsoid centered on the portion 21b overlap. The semiconductor portion 21 having such a shape is formed by, for example, forming trenches for embedding the conductive members 23 and 24, ion-implanting impurities serving as donors through these trenches, embedding the conductive members 23 and 24 and the like in the trenches, and applying a heat treatment to diffuse and activate the impurities. However, the shape of the semiconductor portion 21 is not limited to the above example. For example, the shape of the semiconductor portion 21 may be rectangular parallelepiped or a shape close to rectangular parallelepiped.

A distance between the conductive member 23 and the conductive member 24 in the X direction is Sx. As described above, the length of the conductive member 23 in the X direction is $Lx_{23}$, and the length of the conductive member 24 in the X direction is $Lx_{24}$. A total length of the length $Lx_{23}$ of the conductive member 23 in the X direction, the distance Sx between the conductive member 23 and the conductive member 24, and the length $Lx_{24}$ of the conductive member 24 is $Lx_{11}$. In the embodiments, the length $Lz_{23}$, which is the length from the upper end 23a to the lower end 23b of the conductive member 23, is greater than the length $Lx_{11}$. That is, $Lz_{23}>Lx_{11}$ ($=Lx_{23}+Sx+Lx_{24}$). In one example, the shape of the conductive member 23 is substantially the same as the shape of the conductive member 24, so that the length $Lx_{23}$ is substantially equal to the length $Lx_{24}$.

Contacts 31 and 32 are provided on the semiconductor layer 20. A lower end of the contact 31 is connected to the upper end 23a of the conductive member 23, and a lower end of the contact 32 is connected to the upper end 24a of the conductive member 24. The contacts 31 and 32 are made of a metal material such as tungsten (W), aluminum (Al), or copper (Cu). The resistivity of the contacts 31 and 32 is lower than the resistivity of the conductive members 23 and 24.

A wiring 33 is provided on the contact 31 and is connected to an upper end of the contact 31. A wiring 34 is provided on the contact 32 and is connected to an upper end of the contact 32. An interlayer insulating film 30 made of, for example, silicon oxide is provided on the semiconductor layer 20. The interlayer insulating film 30 covers the contacts 31 and 32 and the wirings 33 and 34. In FIG. 1A, the interlayer insulating film 30 is omitted for convenience of illustration. The same applies to other plan views to be described later.

Next, operations of the semiconductor device 1 according to the present embodiment will be described.

A reference voltage, for example, a ground voltage (GND) is applied to the p-type semiconductor layer 20. On the other hand, a voltage higher than that of the semiconductor layer 20 is applied to the n-type semiconductor portion 21 through the wiring 33, the contact 31, and the conductive member 23. Accordingly, a reverse bias is applied between the semiconductor layer 20 and the semiconductor portion 21. As a result, a depletion layer is formed in an interface between the semiconductor layer 20 and the semiconductor portion 21, and the semiconductor portion 21 is electrically isolated from the semiconductor layer 20.

Accordingly, a current path including the conductive member 23, the semiconductor portion 21, and the conductive member 24 is electrically isolated from the semiconductor layer 20, and a resistance element 11 is formed. As described above, the length $Lz_{23}$ of the conductive member 23 in the Z direction is greater than the length $Lx_{11}$. Therefore, in the resistance element 11, a ratio of the resistance in the Z direction to its total resistance can be increased.

Next, an effect of the present embodiment will be described.

Figure 2A:
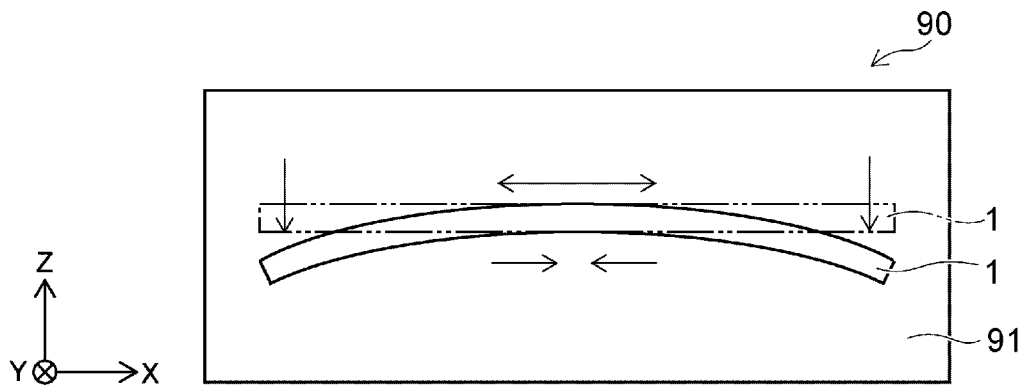
FIG. 2A is a cross-sectional view schematically showing a semiconductor package including the semiconductor device according to the first embodiment.
Figure 2B:
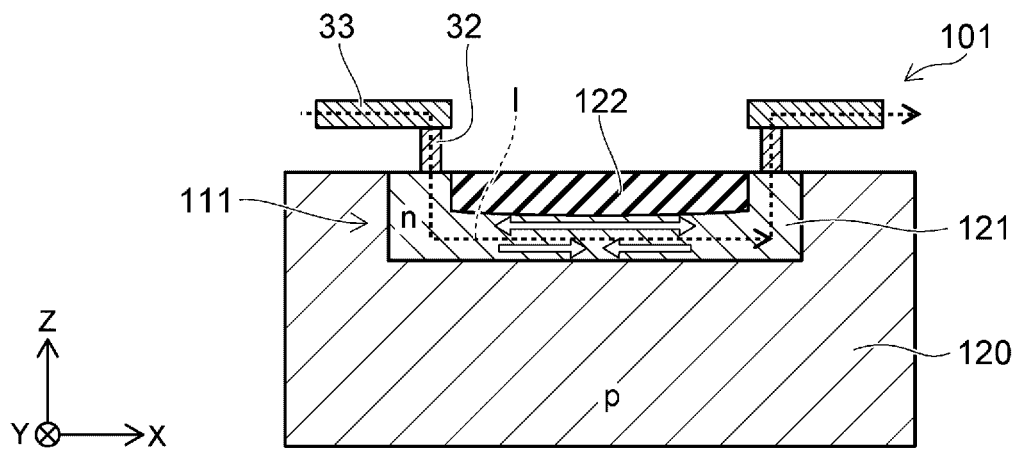
FIG. 2B is a cross-sectional view showing a semiconductor device according to a comparative example.

FIG. 2A is a cross-sectional view schematically showing a semiconductor package including the semiconductor device according to the present embodiment. FIG. 2B is a cross-sectional view showing a semiconductor device according to a comparative example, and FIG. 2C is a cross-sectional view showing the semiconductor device according to the present embodiment.

As shown in FIG. 2A, the semiconductor device 1 is molded in a resin member 91 in a semiconductor package 90, receives a bending stress from the resin member 90 as a result of a molding process or the like, and bends, for example, in the Z direction. Accordingly, stress in the X direction is generated in the semiconductor device 1.

As shown in FIG. 2B, in a semiconductor device 101 according to the comparative example, an n-type semiconductor region 121 is provided on a p-type semiconductor layer 120, and a shallow trench isolation (STI) 122 is provided on a central portion of the semiconductor region 121 in the X direction. Accordingly, a lateral type resistance element 111 is formed in the semiconductor device 101. In the resistance element 111, most of a current path I extends in the X direction. Therefore, in the lateral type resistance element 111, a direction (e.g., X direction) in which stress is applied is consistent with a direction (e.g., X direction) in which most of the current path I extends. As a result, the resistance in the current path I is likely to be affected by the stress. Therefore, the resistance of the resistance element 111 is likely to vary due to stress generated during the molding process and the like.

Figure 2C:
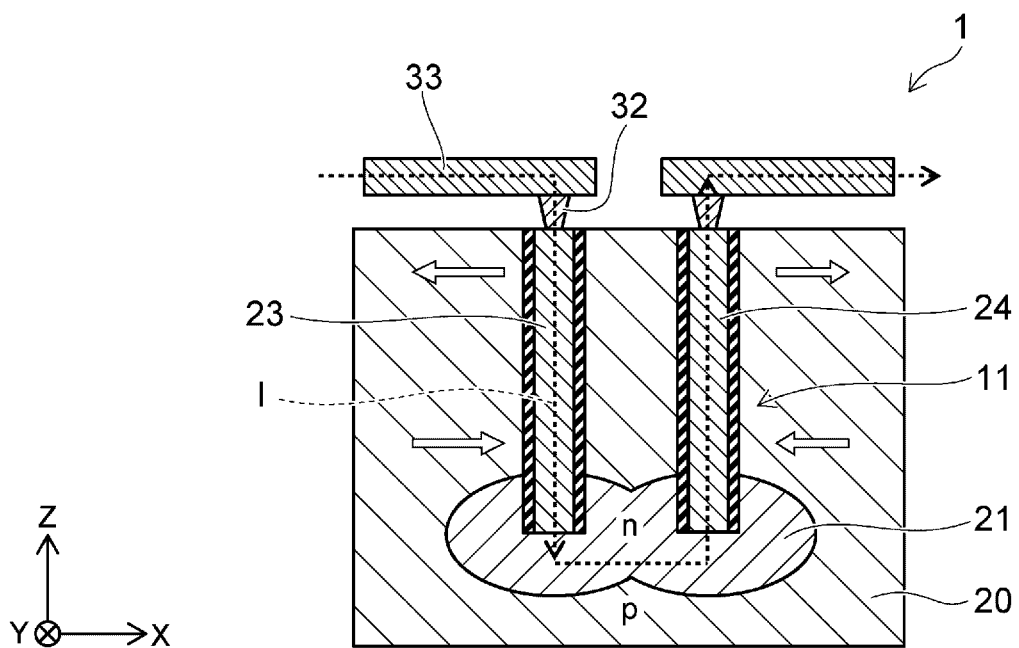
FIG. 2C is a cross-sectional view showing the semiconductor device according to the first embodiment.

In contrast, as shown in FIG. 2C, in the semiconductor device 1 according to the present embodiment, most of the current path I of the resistance element 11 extends in the Z direction. Therefore, the resistance thereof is unlikely to be affected by stress applied in the X direction. As a result, even if the stress in the X direction is applied to the semiconductor device 1 due to the molding process or the like, variations in the resistance of the resistance element 11 can be reduced.

Therefore, the semiconductor device 1 according to the present embodiment enables the resistance of the resistance element 11 in the Z direction to be increased. Accordingly, even if the stress in the X direction is applied to the semiconductor device 1, a lattice distortion in the conductive members 23 and 24 can be reduced, and variations in the resistance can be reduced. Because the resistance of the conductive members 23 and 24 is unlikely to be affected by such stress, the resistance of the resistance element 11 is stabilized.

Further, a length of the resistance element 11 in the Z direction ($Lz_{23}$) is greater than a length in the X direction ($Lx_{11}$), so that the area occupied by the resistance element 11 in the semiconductor device 1 can be reduced. As a result, the semiconductor device 1 can be downsized and highly integrated.

In the present embodiment, an example in which the conductivity type of the semiconductor layer 20 is p-type and the conductivity type of the semiconductor portion 21 is n-type is shown. However, the conductivity type of the semiconductor layer 20 may be n-type, and the conductivity type of the semiconductor portion 21 may be p-type. In this case, a voltage lower than that of the semiconductor layer 20 is applied to the semiconductor portion 21. Accordingly, a reverse bias is applied between the n-type semiconductor layer 20 and the p-type semiconductor portion 21, so that the semiconductor portion 21 can be electrically isolated from the semiconductor layer 20.

Further, in the present embodiment, an example in which the conductive members 23 and 24 are formed of polysilicon is shown. However, the conductive member is not limited to this. For example, the conductive members 23 and 24 may be formed of a conductive material containing silicon such as single crystal silicon or metal silicide, or may be formed of a conductive material containing metal such as a metal or a metal compound. The conductive members 23 and 24 may be formed of a conductive material having appropriate resistivity. Furthermore, the shape of the conductive members 23 and 24 is not limited to the flat plate shape, and may be, for example, a columnar shape extending in the Z direction.

Second Embodiment

Next, a second embodiment will be described.

Figure 3:
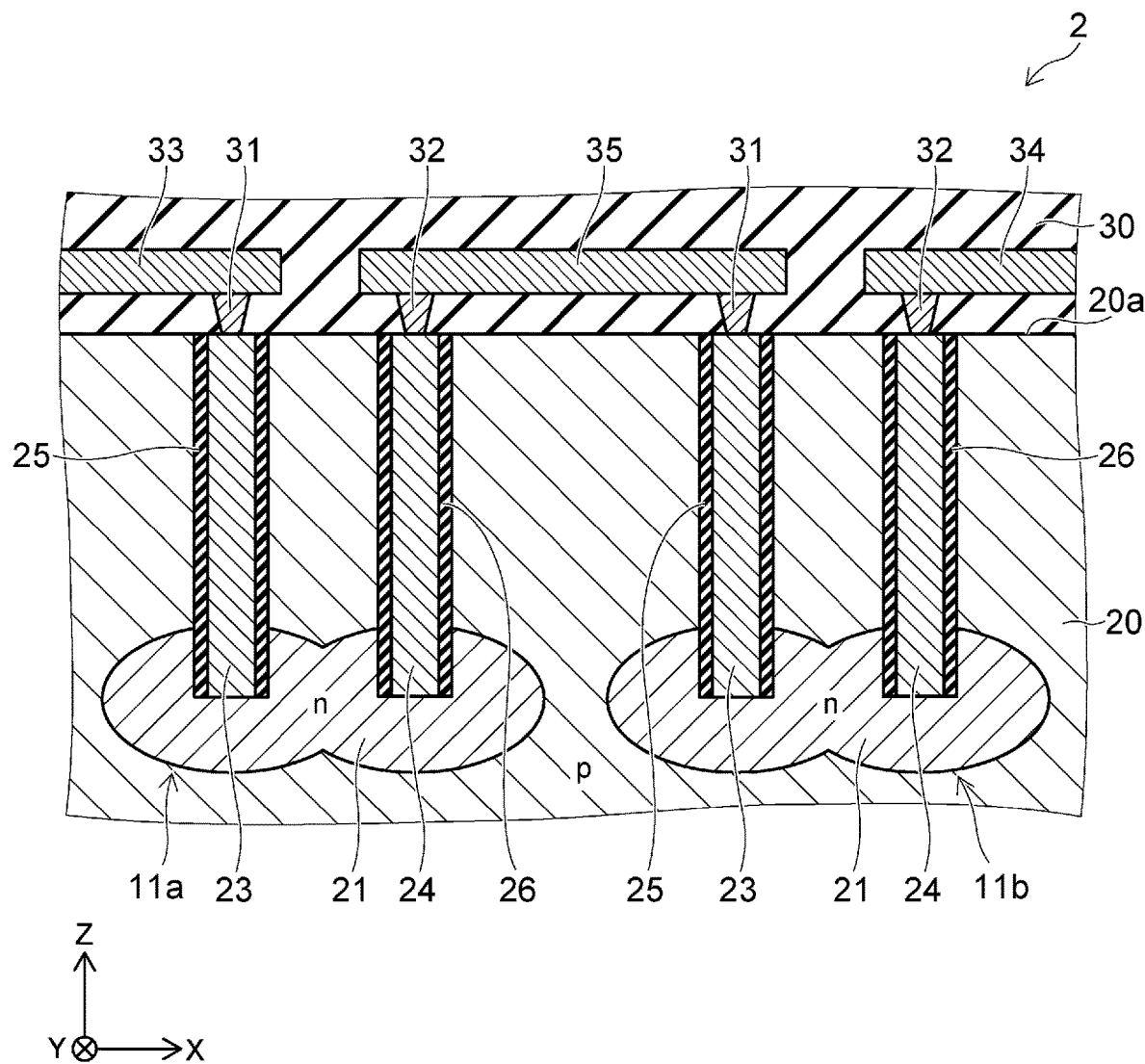
FIG. 3 is a cross-sectional view showing a semiconductor device according to a second embodiment.

FIG. 3 is a cross-sectional view showing a semiconductor device according to the present embodiment.

As shown in FIG. 3, in a semiconductor device 2 according to the present embodiment, resistance elements 11a and 11b are connected in series. Configurations of the resistance elements 11a and 11b are similar to the configuration of the resistance element 11 in the first embodiment. In the semiconductor device 2, a wiring 35 is provided in the interlayer insulating film 30, and is connected to the contact 32 connected to the resistance element 11a and the contact 31 connected to the resistance element 11b.

According to the present embodiment, a large resistance may be obtained by connecting the resistance element 11a and the resistance element 11b in series. Configurations, operations, and effects other than those described above in the present embodiment are similar to those in the first embodiment. In addition, the semiconductor device may have three or more resistance elements connected in series.

Third Embodiment

Next, a third embodiment will be described.

Figure 4:
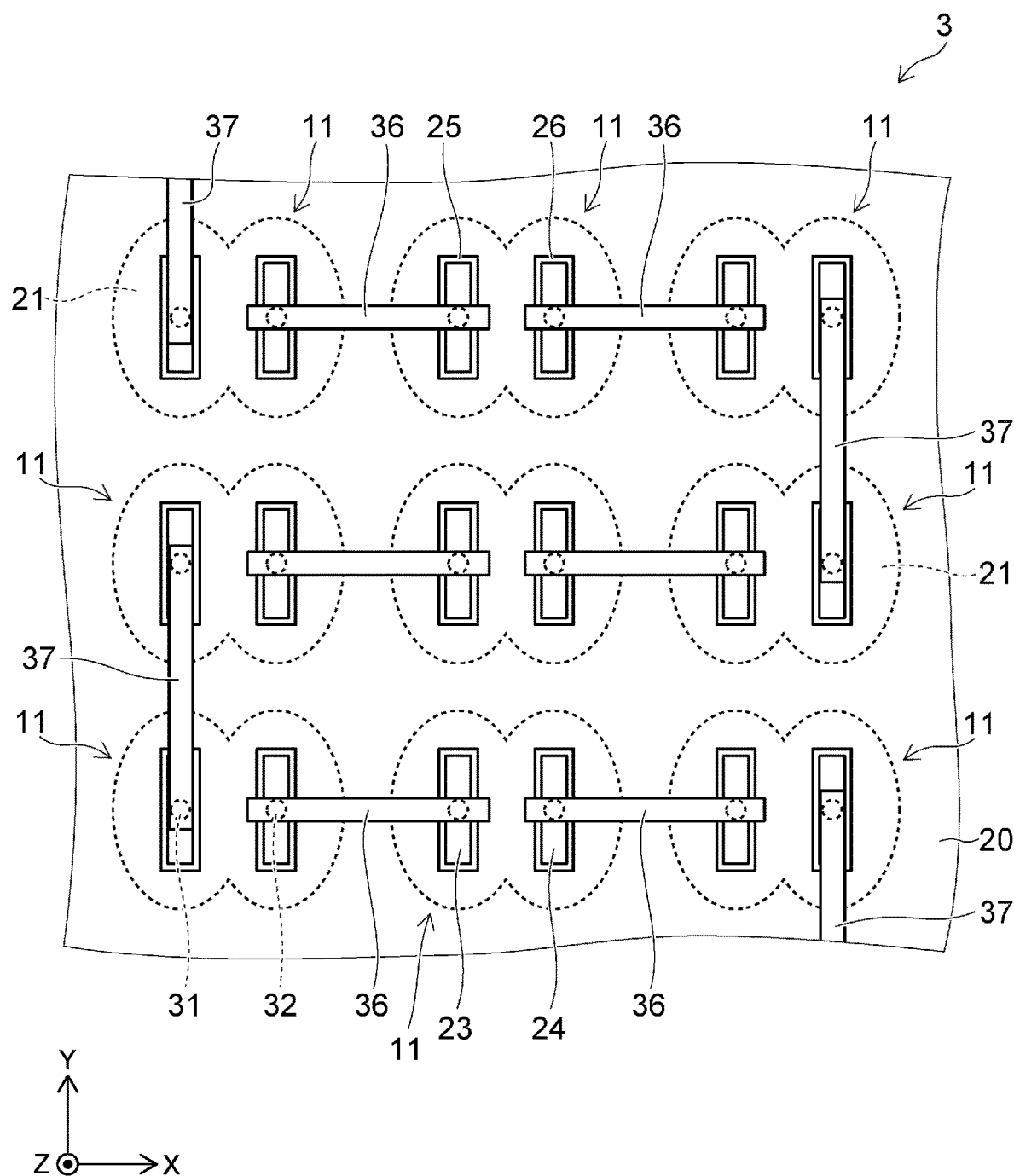
FIG. 4 is a plan view showing a semiconductor device according to a third embodiment.

FIG. 4 is a plan view showing a semiconductor device according to the present embodiment.

As shown in FIG. 4, in a semiconductor device 3 according to the present embodiment, a plurality of resistance elements 11 are provided and arranged in a matrix along the X direction and the Y direction. Further, all the resistance elements 11 are connected in series by connecting the resistance elements 11 to each other by a wiring 36 extending in the X direction and a wiring 37 extending in the Y direction.

According to the present embodiment, a larger resistance than in the first and second embodiments can be obtained by connecting the plurality of resistance elements 11 in series. Further, the plurality of resistance elements 11 may be provided in a predetermined region by arranging the plurality of resistance elements 11 in the matrix along the X direction and the Y direction. Configurations, operations, and effects other than those described above in the present embodiment are similar to those in the first embodiment.

Fourth Embodiment

Next, a fourth embodiment will be described.

Figure 5A:
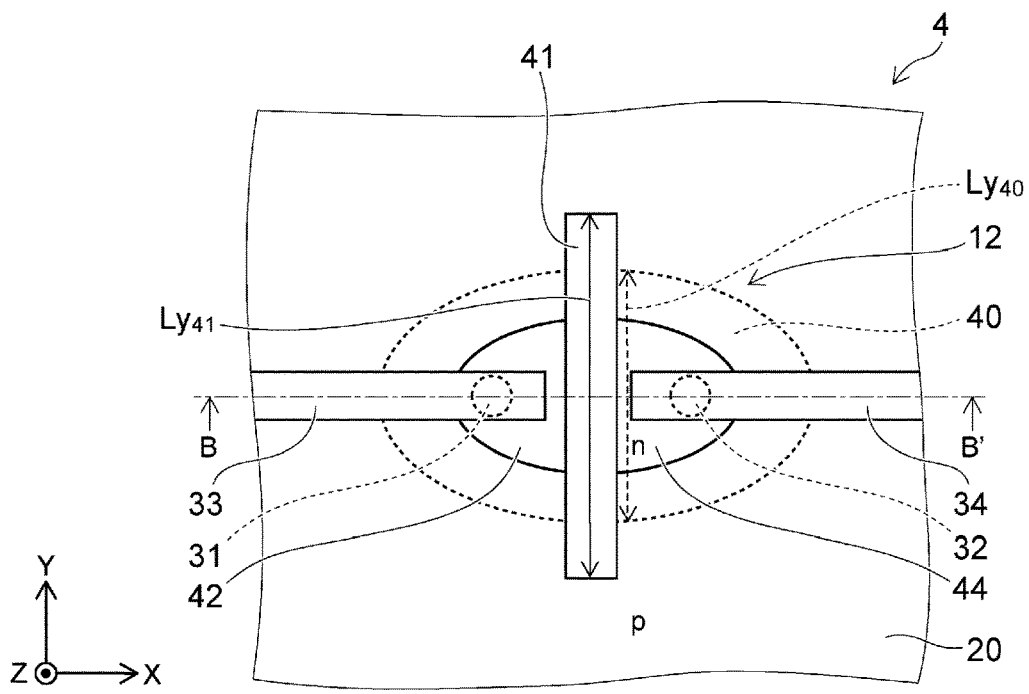
FIG. 5A is a plan view showing a semiconductor device according to a fourth embodiment.
Figure 5B:
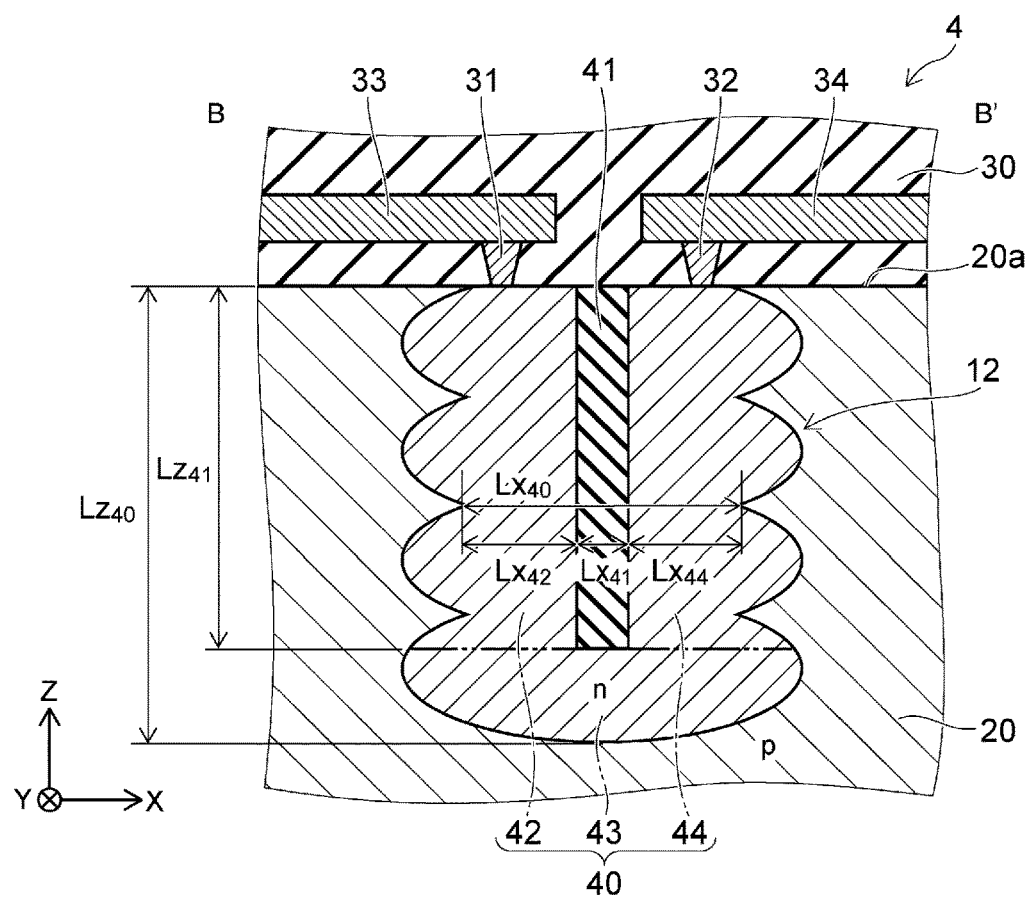
FIG. 5B is a cross-sectional view taken along line B-B' shown in FIG. 5A.

FIG. 5A is a plan view showing a semiconductor device according to the present embodiment, and FIG. 5B is a cross-sectional view taken along line B-B' shown in FIG. 5A.

As shown in FIGS. 5A and 5B, in a semiconductor device 4 according to the present embodiment, an n-type semiconductor portion 40 is provided in the p-type semiconductor layer 20. The semiconductor portion 40 is formed of, for example, silicon containing impurities serving as donors. An upper surface of the semiconductor portion 40 reaches the upper surface 20a of the semiconductor layer 20. A length $Lz_{40}$ of the semiconductor portion 40 in the Z direction is greater than a length $Lx_{40}$ of the semiconductor portion 40 in the X direction.

When the semiconductor portion 40 is formed by an ion implantation method, a shape of the semiconductor portion 40 is, for example, a shape in which a plurality of ellipsoids are stacked in the Z direction. Adjacent ellipsoids partially overlap. On the other hand, when the semiconductor portion 40 is formed by an epitaxial growth method, the shape of the semiconductor portion 40 is, for example, a substantially rectangular parallelepiped. FIGS. 5A and 5B show a case where the semiconductor portion 40 is formed by the ion implantation method. In this case, the length $Lx_{40}$ of the semiconductor portion 40 in the X direction is a value of a constricted portion between the ellipsoids. However, the shape of the semiconductor portion 40 is not limited to this. The shape of the semiconductor portion 40 may be, for example, a rectangular parallelepiped, a columnar shape, or an elongated columnar shape.

An insulating member 41 is provided in the semiconductor layer 20. The insulating member 41 is formed of an insulating material such as silicon oxide. The insulating member 41 has a plate shape extending along the YZ plane. A height of the insulating member 41, that is, a length $Lz_{41}$ in the Z direction is greater than a width of the insulating member 41, that is, a length $Ly_{41}$ in the Y direction. The length $Ly_{41}$ is greater than a thickness of the insulating member 41, that is, a length $Lx_{41}$ in the X direction. Therefore, $Lz_{41} > Ly_{41} > Lx_{41}$. In some embodiments, the length $Ly_{41}$ may be greater than the length $Lz_{41}$.

In the Z direction, the length $Lz_{41}$ of the insulating member 41 is shorter than the length $Lz_{40}$ of the semiconductor portion 40. Therefore, the insulating member 41 does not penetrate through the semiconductor portion 40 in the Z direction, and a portion of the semiconductor portion 40 is also disposed below the insulating member 41. In the Y direction, the length $Ly_{41}$ of the insulating member 41 is greater than the length $Ly_{40}$ of the semiconductor portion 40. The insulating member 41 penetrates through an upper portion of the semiconductor portion 40 in the Y direction. In the X direction, the length $Lx_{41}$ of the insulating member 41 is shorter than the length $Lx_{40}$ of the semiconductor portion 40. The semiconductor portion 40 is disposed on both sides of the insulating member 41 in the X direction.

In this way, the insulating member 41 divides the upper portion of the semiconductor portion 40 into a portion 42 and a portion 44. A portion below the insulating member 41 in the semiconductor portion 40 is referred to as a portion 43. That is, the semiconductor portion 40 includes the portion 42 disposed on one side of the insulating member 41 in the X direction, the portion 43 disposed below the insulating member 41, and the portion 44 disposed on the other side of the insulating member 41 in the X direction. A current path that passes below the insulating member 41 is formed by the portion 42, the portion 43, and the portion 44, and a resistance element 12 is formed by the current path.

The portion 42 of the semiconductor portion 40 corresponds to a first conductive member, the portion 43 corresponds to a first semiconductor portion, and the portion 44 corresponds to a second conductive member. However, the portion 42, the portion 43, and the portion 44 are integrally formed of the same semiconductor material. Further, the portion 42, the portion 43, and the portion 44 are in contact with the insulating member 41.

A length from an upper end to a lower end of the portion 42 is equal to the length $Lz_{41}$ of the insulating member 41 in the Z direction. The portion 42 and the portion 44 are spaced in the X direction. A length of the portion 42 in the X direction is a length $Lx_{42}$, and a length of the portion 44 in the X direction is a length $Lx_{44}$. A distance between the portion 42 and the portion 44 in the X direction is equal to the length $Lx_{41}$ of the insulating member 41 in the X direction. A total of the length $Lx_{42}$, the length $Lx_{41}$, and the length $Lx_{44}$ is equal to the length $Lx_{40}$ of the semiconductor portion 40 in the X direction. Further, in the semiconductor device 4, the length $Lz_{41}$ from the upper end to the lower end of the portion 42 is greater than the length $Lx_{40}$ of the semiconductor portion 40 in the X direction. That is, $Lz_{41} > Lx_{40} = Lx_{42} + Lx_{41} + Lx_{44}$.

The contacts 31 and 32, the wirings 33 and 34, and the interlayer insulating film 30 are provided on the semiconductor layer 20. The contact 31 is connected to the upper end of the portion 42 of the semiconductor portion 40, and the contact 32 is connected to an upper end of the portion 44.

Next, operations of the semiconductor device 4 according to the present embodiment will be described.

A reference voltage, for example, a ground voltage (GND) is applied to the p-type semiconductor layer 20. On the other hand, a voltage higher than that of the semiconductor layer 20 is applied to the n-type semiconductor portion 40 via the wiring 33 and the contact 31. Accordingly, a reverse bias is applied between the semiconductor layer 20 and the semiconductor portion 40. As a result, the semiconductor portion 40 is electrically isolated from the semiconductor layer 20.

Accordingly, a current path including the portion 42, the portion 43, and the portion 44 of the semiconductor portion 40 is electrically isolated from the semiconductor layer 20, and the resistance element 12 is formed. As described above, the length of the portion 42 in the Z direction ($Lz_{41}$) is greater than the length of the semiconductor portion 40 in the X direction ($Lx_{40}$), so that in the resistance element 12, a ratio of a resistance in the Z direction to its total resistance can be increased.

Next, an effect of the present embodiment will be described.

In the present embodiment, in the resistance element 12, the resistance in the Z direction can also be increased. Accordingly, even if stress in the X direction is applied to the semiconductor device 4, the resistance of the portions 42 and 44 is unlikely to be affected by the stress, and so the resistance of the resistance element 12 is stabilized. Configurations, operations, and effects other than those described above in the present embodiment are similar to those in the first embodiment.

In the present embodiment, an example in which the conductivity type of the semiconductor layer 20 is p-type and the conductivity type of the semiconductor portion 40 is n-type is shown. However, the conductivity type of the semiconductor layer 20 may be n-type, and the conductivity type of the semiconductor portion 40 may be p-type. In this case, a voltage lower than that of the semiconductor layer 20 is applied to the semiconductor portion 40. Accordingly, a reverse bias is applied between the n-type semiconductor layer 20 and the p-type semiconductor portion 40, so that the semiconductor portion 40 may be electrically isolated from the semiconductor layer 20.

Fifth Embodiment

Next, a fifth embodiment will be described.

Figure 6A:
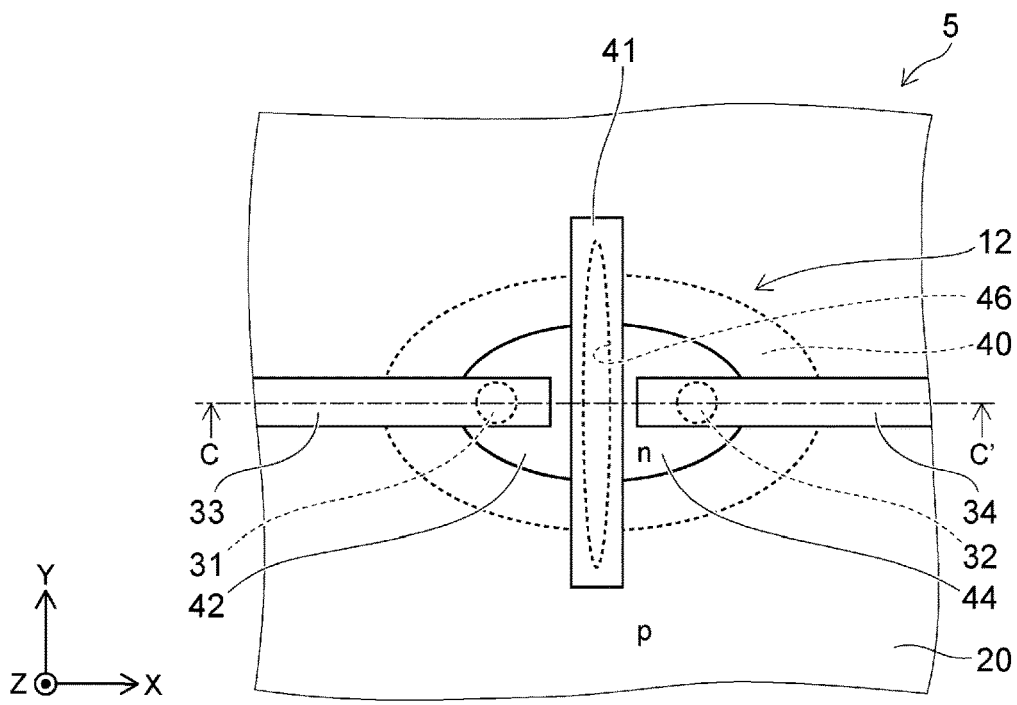
FIG. 6A is a plan view showing a semiconductor device according to a fifth embodiment.
Figure 6B:
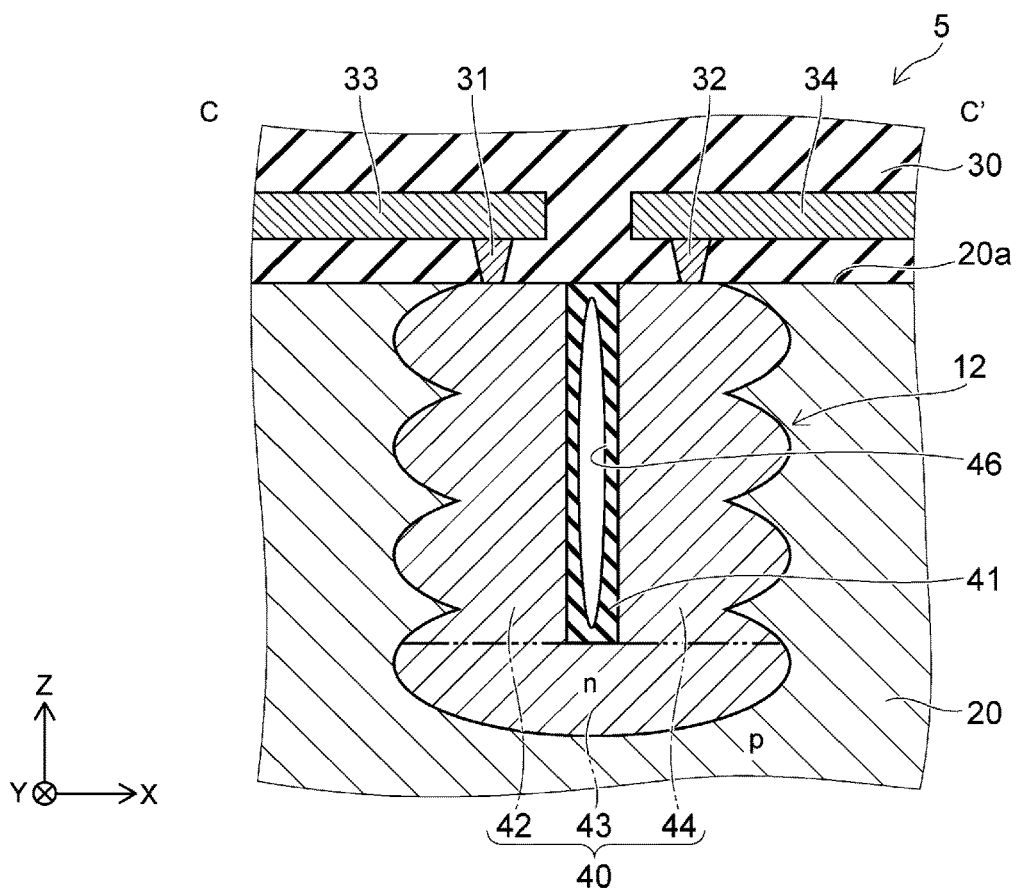
FIG. 6B is a cross-sectional view taken along line C-C' shown in FIG. 6A.

FIG. 6A is a plan view showing a semiconductor device according to the present embodiment, and FIG. 6B is a cross-sectional view taken along line C-C' shown in FIG. 6A.

As shown in FIGS. 6A and 6B, a semiconductor device 5 according to the present embodiment has an air gap 46 which is formed inside the insulating member 41. The air gap 46 is separated from a surface of the insulating member 41.

In the present embodiment, the air gap 46 absorbs stress applied to the semiconductor device 5. Accordingly, influence of stress on the resistance of the semiconductor portion 40 is further reduced, and the resistance of the resistance element 12 is further stabilized. Configurations, operations, and effects other than those described above in the present embodiment are similar to those in the fourth embodiment.

Sixth Embodiment

Next, a sixth embodiment will be described.

Figure 7A:
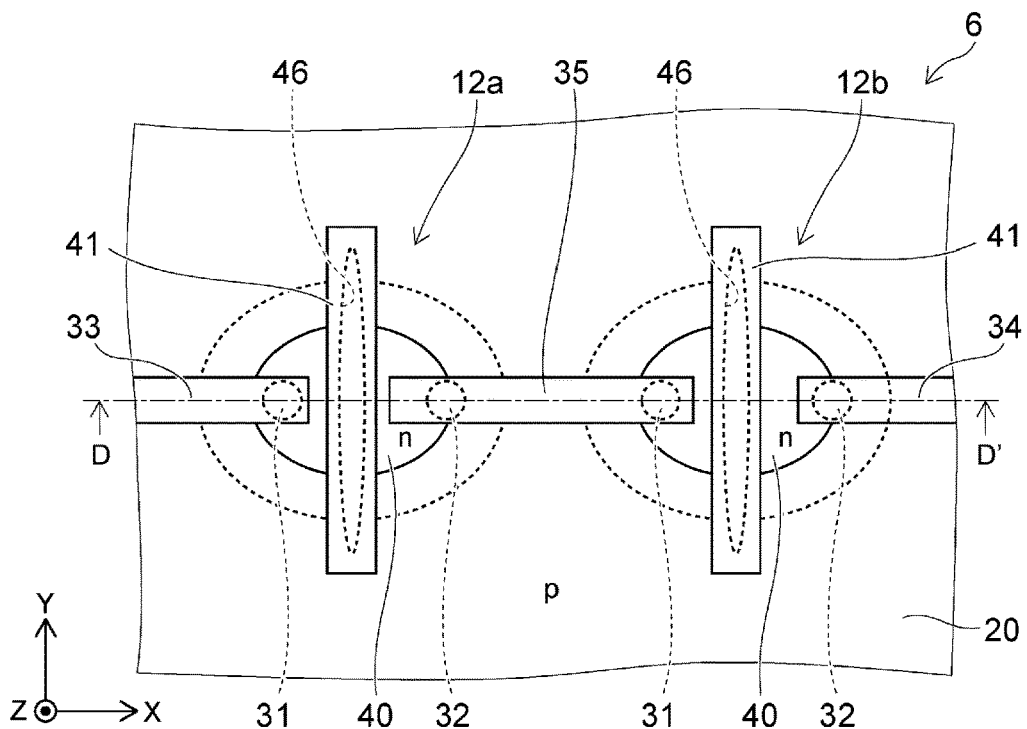
FIG. 7A is a plan view showing a semiconductor device according to a sixth embodiment.
Figure 7B:
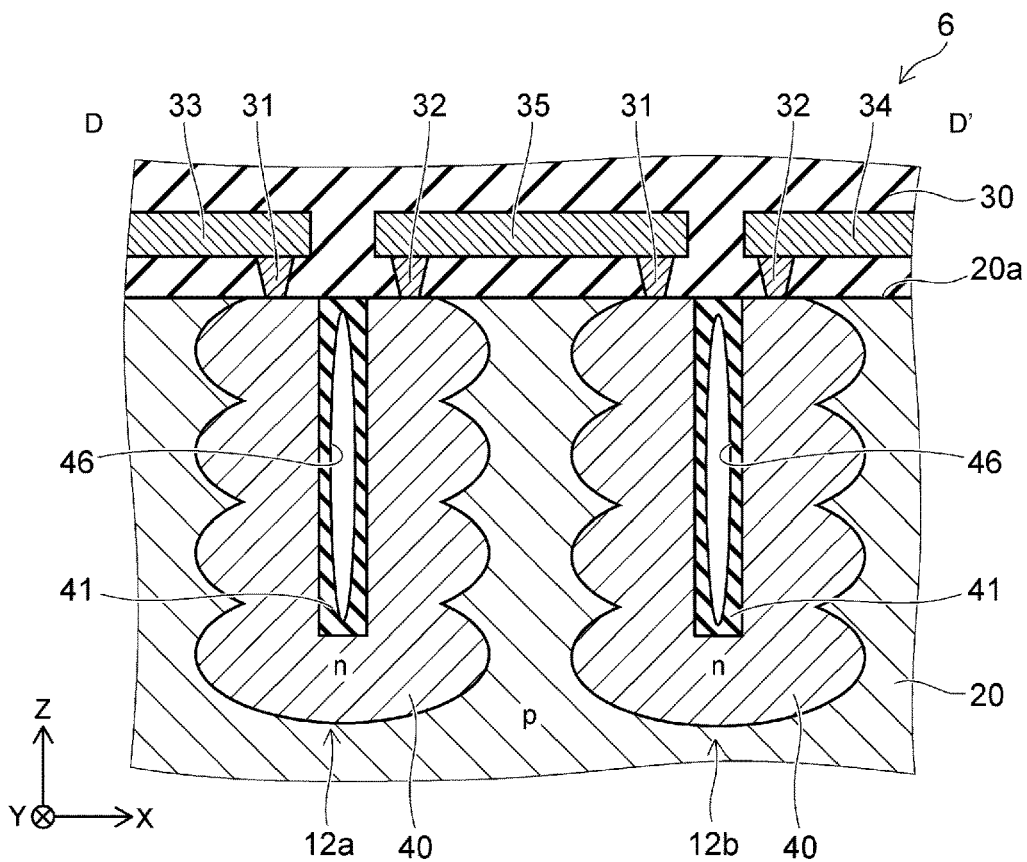
FIG. 7B is a cross-sectional view taken along line D-D' shown in FIG. 7A.

FIG. 7A is a plan view showing a semiconductor device according to the present embodiment, and FIG. 7B is a cross-sectional view taken along line D-D' shown in FIG. 7A.

As shown in FIGS. 7A and 7B, in a semiconductor device 6 according to the present embodiment, resistance elements 12a and 12b are connected in series. The configuration of the resistance elements 12a and 12b is similar to the configuration of the resistance element 12 in the fifth embodiment. In the semiconductor device 6, the wiring 35 is provided in the interlayer insulating film 30, and is connected to the contact 32 connected to the resistance element 12a and the contact 31 connected to the resistance element 12b.

According to the present embodiment, a large resistance may be obtained by connecting the resistance element 12a and the resistance element 12b in series. Configurations, operations, and effects other than those described above in the present embodiment are similar to those in the fifth embodiment.

Seventh Embodiment

Next, a seventh embodiment will be described.

Figure 8A:
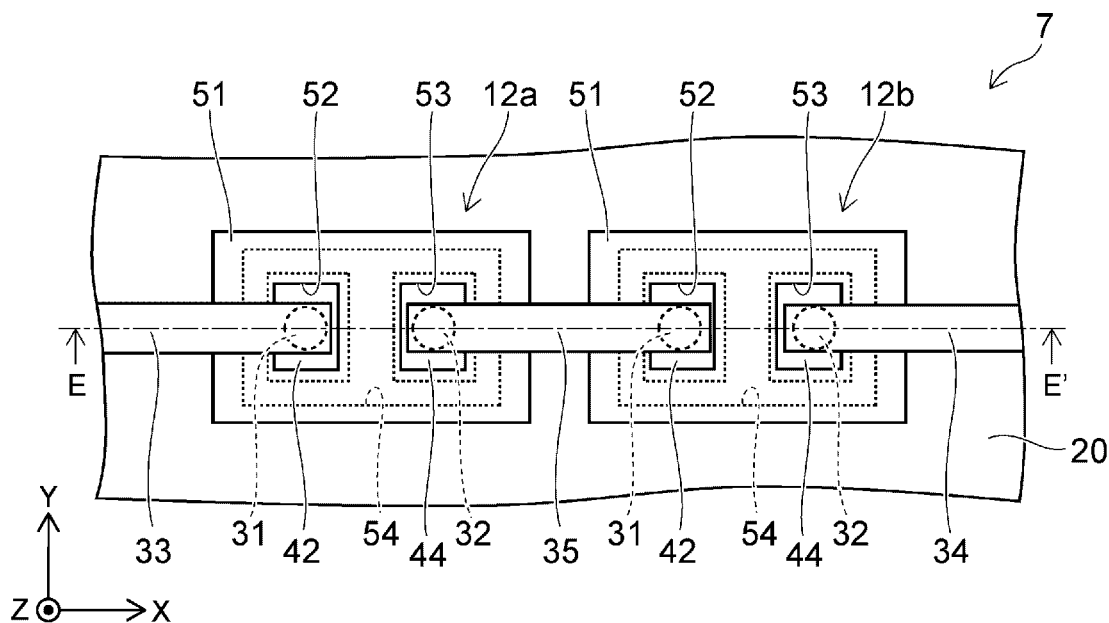
FIG. 8A is a plan view showing a semiconductor device according to a seventh embodiment.
Figure 8B:
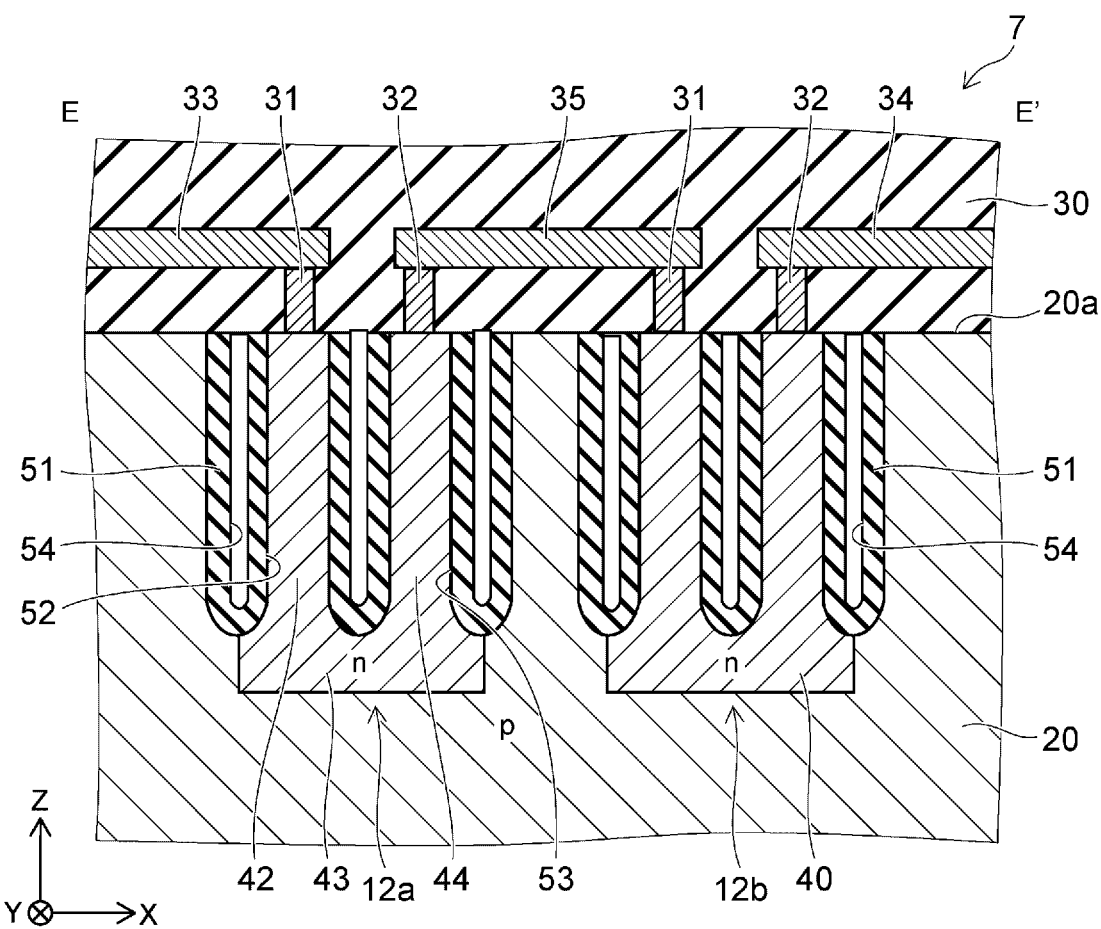
FIG. 8B is a cross-sectional view taken along line E-E' shown in FIG. 8A.

FIG. 8A is a plan view showing a semiconductor device according to the present embodiment, and FIG. 8B is a cross-sectional view taken along line E-E' shown in FIG. 8A.

As shown in FIGS. 8A and 8B, a semiconductor device 7 according to the present embodiment is different in that an insulating member 51 is provided instead of the insulating member 41 as compared with the semiconductor device 6 according to the sixth embodiment (see FIGS. 7A and 7B).

The insulating member 51 has a figure-eight tubular shape instead of a flat plate shape when viewed in the Z direction. Each insulating member 51 is formed with two through-holes 52 and 53. The through-holes 52 and 53 penetrate through the insulating member 51 in the Z direction. Further, the portion of the semiconductor portion 40 is disposed in the through-hole 52, and the portion 44 of the semiconductor portion 40 is disposed in the through-hole 53. Further, the portion 43 of the semiconductor portion 40 is disposed below the insulating member 51. The portion 42, the portion 43, and the portion 44 are integrally formed as one semiconductor portion 40 by, for example, an n-type semiconductor material. In the present embodiment, an example in which the shape of the semiconductor portion 40 is a rectangular parallelepiped is shown. However, the shape of the semiconductor portion 40 is not limited to this.

An air gap 54 is formed in the insulating member 51. A shape of the air gap 54 is a figure-eight shape that surrounds the through-holes 52 and 53 when viewed in the Z direction. In some embodiments, air gap 54 may not be formed or may be partially formed.

In the present embodiment, the insulating member 51 surrounds the portion 42 and the portion 44 of the semiconductor portion 40. Accordingly, the portions 42 and 44 can be reliably separated from the semiconductor layer 20. In addition, since no depletion layer is formed in the portion 42 and the portion 44, an effective cross-sectional area of a current path can be set accurately, and the resistance of the resistance elements 12a and 12b can be controlled with high accuracy. Configurations, operations, and effects other than those described above in the present embodiment are similar to those in the sixth embodiment.

According to the embodiments described above, a semiconductor device in which variations in resistance of a resistance element can be reduced even when stress is applied and that enables a reduction in size.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor layer of a first conductivity type;
   a first semiconductor portion of a second conductivity type provided in the semiconductor layer;
   a first conductive member having an upper end reaching an upper surface of the semiconductor layer and a lower end connected to the first semiconductor portion, wherein the first conductive member has a shape that extends in a first direction, a second direction, and a third direction, the first, second, and third directions each being perpendicular to each other, and the third direction being parallel to the upper surface of the semiconductor layer;
   a second conductive member having an upper end reaching the upper surface of the semiconductor layer and a lower end connected to the first semiconductor portion, wherein the second conductive member has a shape that is substantially the same shape as the first conductive member, and the second conductive member extends in the first, second, and third directions;
   a first insulating film covering a side surface of the first conductive member to electrically isolate the first conductive member from the semiconductor layer; and
   a second insulating film covering a side surface of the second conductive member to electrically isolate the second conductive member from the semiconductor layer,
   wherein a length of each of the first conductive member and the second conductive member in the first direction is greater than a total of a length of the first conductive member in the third direction, a distance between the first conductive member and the second conductive member in the third direction, and a length of the second conductive member in the third direction, and
   wherein a length of each of the first conductive member and the second conductive member in the second direction is greater than the total of the length of the first conductive member in the third direction, the distance between the first conductive member and the second conductive member in the third direction, and the length of the second conductive member in the third direction.

2. The semiconductor device according to claim 1, further comprising:
   a first contact which is provided on the semiconductor layer, is connected to the upper end of the first conductive member, and has a resistivity lower than a resistivity of the first conductive member.

3. The semiconductor device according to claim 1,
   wherein the first conductive member and the second conductive member include silicon.

4. The semiconductor device according to claim 1, wherein the first conductivity type is a p-type, and the second conductivity type is an n-type.

5. The semiconductor device according to claim 1, wherein the first conductivity type is an n-type, and the second conductivity type is a p-type.

6. The semiconductor device according to claim 1, further comprising:
   a second semiconductor portion of the second conductivity type provided in the semiconductor layer and separated from the first semiconductor portion;
   a third conductive member having an upper end reaching the upper surface of the semiconductor layer and a lower end connected to the second semiconductor portion;

a fourth conductive member having an upper end reaching the upper surface of the semiconductor layer and a lower end connected to the second semiconductor portion; and a wiring serially connecting the upper end of the second conductive member to the upper end of the third conductive member.

7. A semiconductor device, comprising:

a semiconductor layer of a first conductivity type;

a plurality of semiconductor portions of a second conductivity type provided in the semiconductor layer, the plurality of semiconductor portions being arranged in a matrix configuration when viewed along a first direction that is perpendicular to an upper surface of the semiconductor layer;

a plurality of pairs of first and second conductive members, each of the first and second conductive members having an upper end reaching the upper surface of the semiconductor layer and a lower end connected to one of the plurality of semiconductor portions;

a plurality of first insulating films, each covering a side surface of one of the first conductive members;

a plurality of second insulating films, each covering a side surface of one of the second conductive members;

a first wiring serially connecting upper ends of first conductive members to upper ends of second conductive members for first and second conductive members that have lower ends respectively connected to two of the semiconductor portions that are adjacent in a second direction that is parallel to the upper surface of the semiconductor layer and perpendicular to the first direction; and a second wiring serially connecting upper ends of first conductive members to upper ends of second conductive members for first and second conductive members that have lower ends respectively connected to two of the semiconductor portions that are adjacent in a third direction that is perpendicular to the first and second directions, wherein, in each pair of first and second conductive members, a length from the upper end to the lower end of the first conductive member is greater than a total of a length of the first conductive member in the second direction, a distance between the first conductive member and the second conductive member in the second direction, and a length of the second conductive member in the second direction.

8. The semiconductor device according to claim 7, wherein all of the semiconductor portions have substantially the same shape, and all of the first and second conductive members have substantially the same shape.

9. The semiconductor device according to claim 8, wherein all of the first conductive members and all of the second conductive members have shapes that extend in the first, second, and third directions, wherein in each pair of first and second conductive members, a length of each of the first conductive member and the second conductive member in the first direction is greater than the total of the length of the first conductive member in the second direction, the distance between the first conductive member and the second conductive member in the second direction, and the length of the second conductive member in the second direction, and wherein in each pair of first and second conductive members, a length of each of the first conductive member and the second conductive member in the third direction is greater than the total of the length of the first conductive member in the second direction, the distance between the first conductive member and the second conductive member in the second direction, and the length of the second conductive member in the second direction.

10. The semiconductor device according to claim 7, further comprising:

a plurality of first contacts which are each provided on the semiconductor layer, are each connected to the upper end of one of the first conductive members, and each have a resistivity lower than a resistivity of the one of the first conductive members.

11. The semiconductor device according to claim 7, wherein all of the first conductive members and all of the second conductive members include silicon.

12. The semiconductor device according to claim 7, wherein the first conductivity type is a p-type and the second conductivity type is an n-type.

13. The semiconductor device according to claim 7, wherein the first conductivity type is an n-type and the second conductivity type is a p-type.

* * * * *